(12) United States Patent
Krishnan et al.

(10) Patent No.: US 7,570,181 B2
(45) Date of Patent: Aug. 4, 2009

(54) METHOD AND SYSTEM FOR INPUT VOLTAGE DROOP COMPENSATION IN VIDEO/GRAPHICS FRONT-ENDS

(75) Inventors: Sundararajan Krishnan, Bangalore (IN); C. Srinivasan, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 11/760,780

(22) Filed: Jun. 10, 2007

(65) Prior Publication Data
US 2007/0285299 A1    Dec. 13, 2007

(51) Int. Cl.
*H03M 1/06*    (2006.01)
(52) U.S. Cl. ...................................... 341/118
(58) Field of Classification Search .......... 341/118–122, 341/143, 155, 172
See application file for complete search history.

(56) References Cited

U.S. PATENT DOCUMENTS

| | | | |
|---|---|---|---|
| 5,220,326 A | | 6/1993 | Ledzius et al. |
| 5,387,914 A | | 2/1995 | Mangelsdorf |
| 5,541,599 A | * | 7/1996 | Kasha et al. ................. 341/122 |
| 5,796,300 A | * | 8/1998 | Morgan ......................... 330/9 |
| 6,400,301 B1 | | 6/2002 | Kulhalli et al. ............... 341/155 |
| 6,433,712 B1 | * | 8/2002 | Ohnhaeuser et al. ........ 341/118 |
| 6,535,157 B1 | | 3/2003 | Garrity et al. |
| 6,661,214 B1 | * | 12/2003 | Hann et al. .................. 323/280 |
| 6,674,383 B2 | * | 1/2004 | Horsley et al. ............... 341/152 |
| 6,825,790 B2 | | 11/2004 | Chou |
| 6,891,493 B2 | | 5/2005 | Whittaker et al. |
| 6,894,501 B1 | * | 5/2005 | Flasck et al. ................. 324/416 |
| 6,933,873 B1 | * | 8/2005 | Horsley et al. ............... 341/148 |
| 6,963,300 B1 | | 11/2005 | Lee |
| 7,042,383 B2 | * | 5/2006 | Mishra et al. ................ 341/156 |
| 7,046,046 B2 | * | 5/2006 | Temes et al. ................... 327/91 |
| 7,084,791 B2 | * | 8/2006 | Cesura et al. ................ 341/118 |
| 7,158,443 B2 | | 1/2007 | Lin |
| 7,248,199 B2 | | 7/2007 | Asano et al. |
| 7,253,686 B2 | | 8/2007 | Ali |
| 7,285,996 B2 | | 10/2007 | Fiedler |
| 7,477,079 B2 | * | 1/2009 | Gaboriau et al. ............. 327/94 |
| 2002/0027453 A1 | * | 3/2002 | Kulhalli et al. ............... 327/96 |
| 2005/0212575 A1 | | 9/2005 | Kim |
| 2007/0030753 A1 | | 2/2007 | Kwak |
| 2007/0046345 A1 | | 3/2007 | Tai et al. |
| 2008/0054963 A1 | | 3/2008 | Masenas |

FOREIGN PATENT DOCUMENTS

WO    WO 99/63414    12/1999

* cited by examiner

*Primary Examiner*—Linh V Nguyen
(74) *Attorney, Agent, or Firm*—Kanika Radhakrishnan; Evergreen Valley Law Group P.C.

(57) ABSTRACT

Methods and systems for input voltage droop compensation in video/graphics front-end systems. The method of an embodiment of the invention captures input voltage information supplied to an Analog-to-Digital Converter (ADC) operatively coupled to a bypass capacitor in a video/graphics front-end system; calculates a droop in the input voltage in ADC due to a charge sharing between an input sampling capacitor of the ADC and the bypass capacitor; and compensates for the value of the bypass capacitor using an output of the ADC. Embodiments of the invention provide an improved freedom in the choice of off-chip bypass capacitance in video/graphics front-end systems.

20 Claims, 4 Drawing Sheets

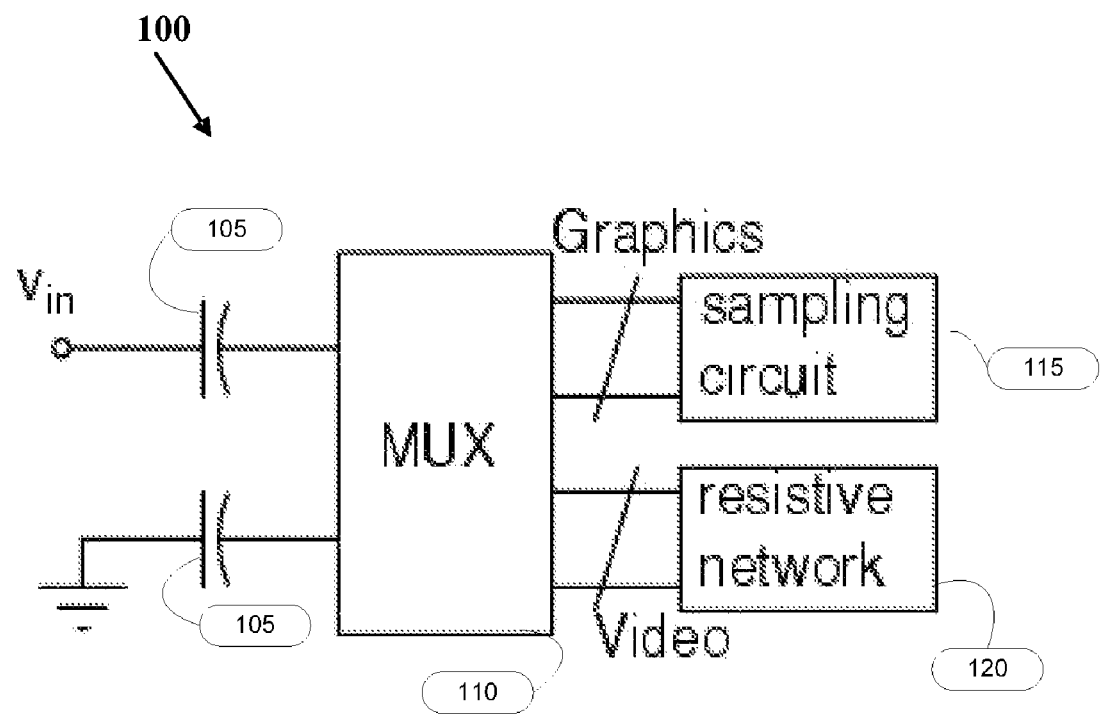
FIG: 1(Prior Art)

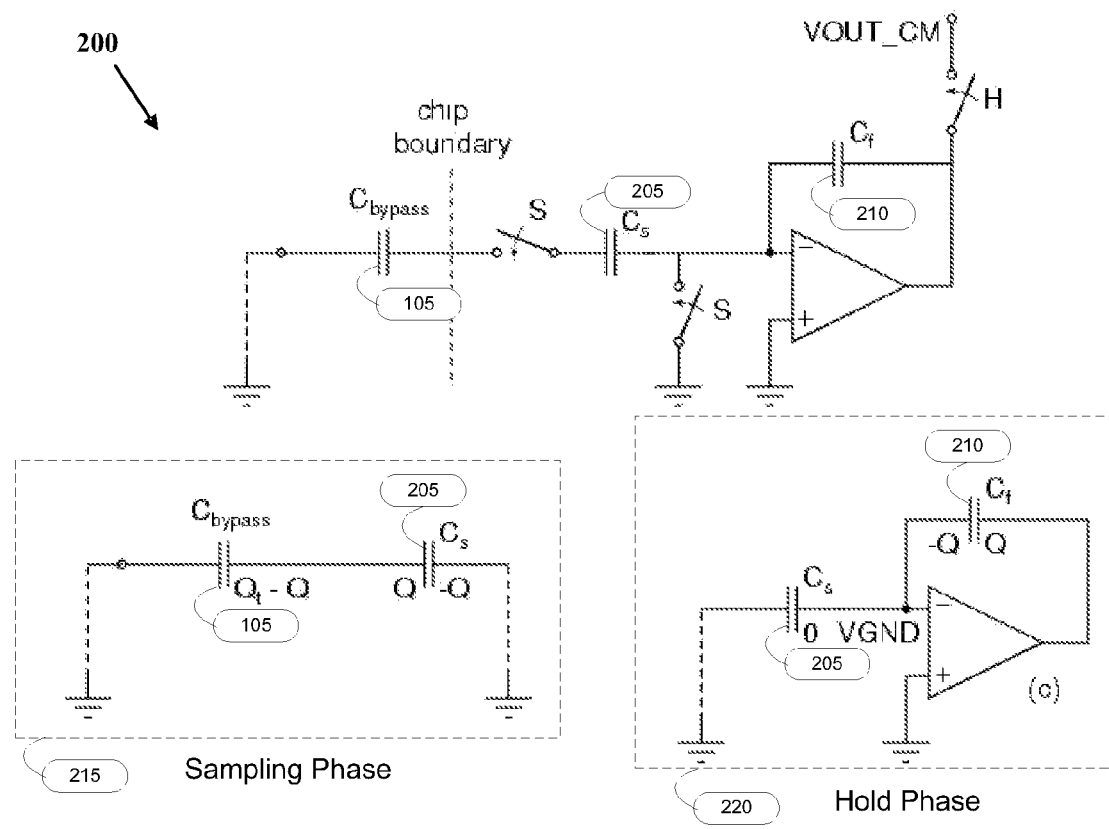
FIG: 2 (Prior Art)

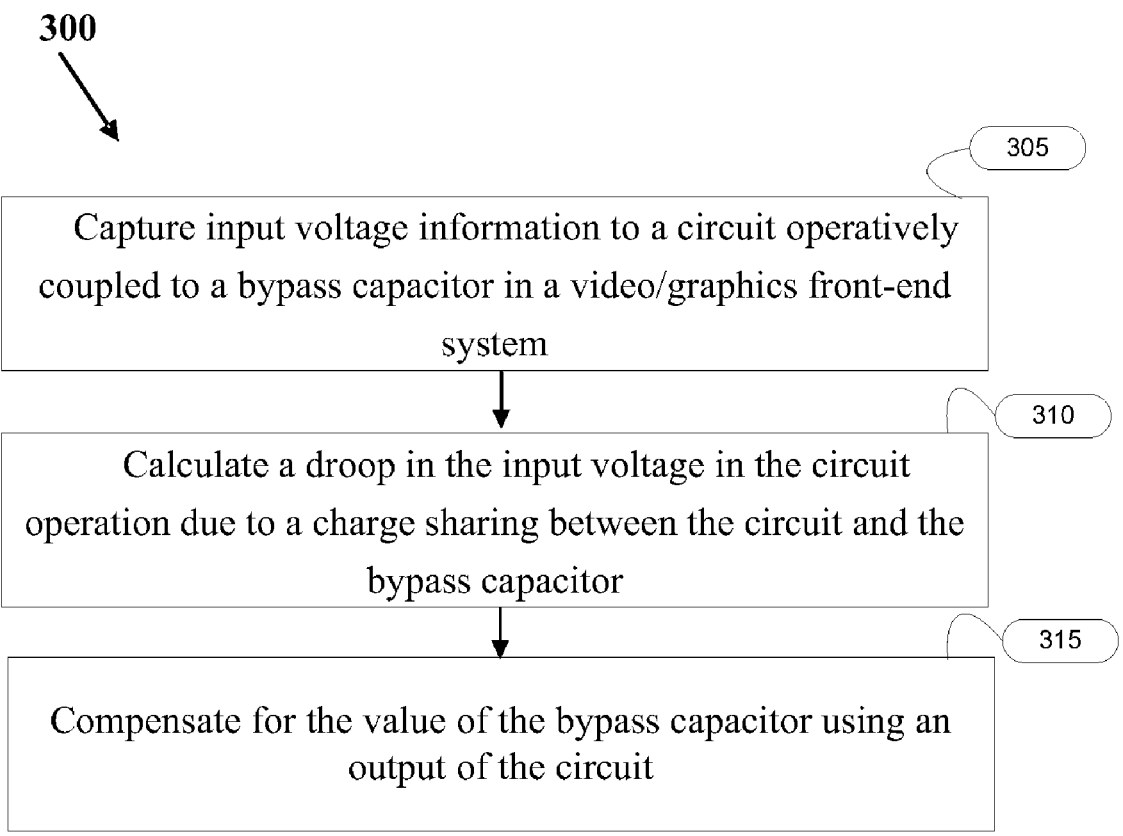
FIG: 3

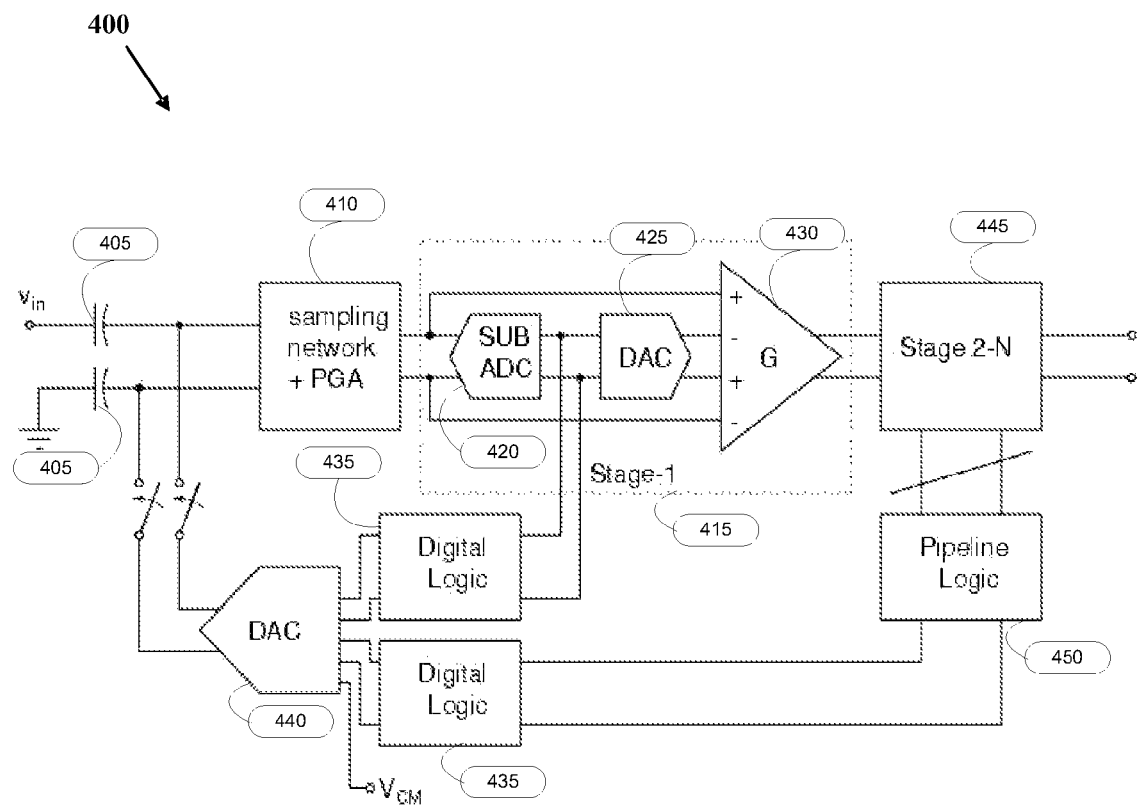
FIG: 4

METHOD AND SYSTEM FOR INPUT VOLTAGE DROOP COMPENSATION IN VIDEO/GRAPHICS FRONT-ENDS

CROSS-REFERENCE TO RELATED APPLICATIONS

This application claims priority to Indian Provisional Patent Application No. 1004/CHE/2006, filed Jun. 9, 2006, and Indian Non-Provisional Patent Application No. E-2/114/2007, filed Jun. 8, 2007, which are incorporated herein by reference.

BACKGROUND

1. Technical Field

Embodiments of the invention relate generally to video/graphics front-ends and more specifically to a method and system for input voltage droop compensation in video/graphics front-end systems.

2. Discussion of Prior Art

Video/graphics front-ends generally refer to the analog circuits used for processing and converting input analog signals (graphics or video signals as the case maybe) to digital signals. To provide different DC voltages between the signal and on the chip, a DC-bypass capacitor is used off the chip. Presence of this bypass capacitor typically imposes constraints on the driving-point impedance offered by the on-chip circuits.

DC restoration is a common problem faced in video and graphics front-ends. The video/graphics front-end systems are built using AC coupling which includes a series capacitance. Due to the series capacitance, the DC voltages of the on-chip and off-chip circuits in the system will be different because the capacitor blocks the DC voltages. The action of restoring the DC voltages for the smooth functioning of the system is referred to as DC restoration. A simplified block diagram for a typical video/graphics front-end is illustrated in FIG. 1, 100. The video/graphics front-end system includes a bypass capacitor 105 coupled to an input voltage and to a multiplexer 110. The multiplexer 110 is coupled to a graphics system and a video system. The input network of a graphics system is a sampling circuit 115, while the input network of a video system is a resistive network 120. Since the sampling circuit 115 shares charge with the external bypass capacitor 105, there is a steady degradation in the charge held by the bypass capacitor 105. In other words, the switching network at the input of the graphics front-end can be equivalently modeled as a resistive network. Hence, the problem of DC restoration can be expressed (and solved) in the same terms for both video and graphics front-ends.

Hence, without loss of generality, consider the graphics front-end illustrated in FIG. 2, 200, together with separate diagrams depicting the sample and hold phases thereof, of an Analog-To-Digital converter (ADC) used in a typical graphics front-end system. During every sampling phase 215, the switches S are closed resulting in an effective sampling circuit 215 in which the sampling capacitor 205 is coupled to the bypass capacitor 105 and becomes charged to the input voltage by sharing charge with the bypass capacitor 105. Depending on the initial charge held by the sampling capacitor 205, there will be some amount of loss of charge in the bypass capacitor 105. Thereafter, switches S are opened and switch H is closed initiating the hold-phase as illustrated by the effective circuit 220. During this phase the charge held by the sampling capacitor 205 is transferred to the feedback capacitor 210 as the sampling capacitor 205 is discharged. Charge on the VGND node is conserved as illustrated in FIG. 2, 200. In the next sampling phase (215), the completely discharged sampling capacitor 205 is coupled back to the bypass capacitor 105 and the process is repeated. In each cycle, a completely discharged sampling capacitor 205 charges itself to the input value by drawing charge from the bypass capacitor 105.

However, as the signal transfer operation proceeds, the charge on the bypass capacitor 105 (which acts as a pseudo voltage-source) faces a gradual reduction due to the ADC operation as explained above. This loss in charge manifests itself as an error in the sampled voltage (relative to the ideal input value), and will appear as an error in the ADC code once the loss is such that the sampled voltage drops by >1 LSB of the ADC. This problem becomes increasingly severe as the resolution of the ADC increases. For example, the actual droop-voltage that can be tolerated is smaller; and in addition, the requirement on the input-referred noise of the ADC demands the use of a larger sampling capacitor 205 which in turn increases the rate at which the input signal droops. Considering typical values of 100 nF for the bypass capacitor 105 and 4 pF for the input sampling capacitor 205 (a 12-bit system will dictate that a sampling capacitor of this order be used), it can be shown that under worst-case conditions where the input signal is white, the signal will droop by 1 LSB for every 6 pixels. To counter this droop, DC restoration is required.

Most of the available ADCs today have a resolution of 8 bits. Relative to a 12-bit ADC, an 8-bit ADC has $1/16^{th}$ the resolution. And it is apparent that, the input sampling capacitance can be made much smaller. The choice of input sampling capacitor value is based on matching considerations. For example, if the capacitor were to be made 256× smaller, it would contribute the same noise when expressed as a fraction of the LSB, and 32× down-scaling is easily possible). As a result, a droop of 1 LSB occurs for every 3072 pixels. It is thus more than sufficient in these systems if the DC is restored once a line (1024 pixels typically), and consequently, the ADCs employed in today's systems use the blank-level (available every line) to restore the DC. However, with increasing resolution in the ADCs, this is no longer possible.

Hence, there is a need to provide a solution for input voltage droop compensation and reduction in the value of the bypass capacitance in video/graphics front-end systems.

SUMMARY

It is therefore an object of the embodiments of the invention to provide a method and system for achieving input voltage droop compensation in video/graphics front-ends.

Another object of the embodiments of the invention is to provide an architecture which permits reduction of off-chip DC bypass capacitance in video/graphics front-end systems.

Still another object of the embodiments of the invention is to provide an architecture that can support increased signal swing at the input of the video front end.

A further object of the embodiments of the invention is to provide an architecture that utilizes local (coarse) as well as global (fine) cancellation to achieve compensation of input droop in video/graphics front-end systems.

Yet another object of the embodiments of the invention is to provide an architecture for droop compensation in video/graphic front-end systems that compensate both common-mode and differential-mode droop.

An exemplary method of an embodiment of the invention provides an input voltage droop compensation method and system in video/graphics front-end systems. The method captures the input voltage information to a circuit operatively coupled to a bypass capacitor; calculates a droop in the input voltage in the circuit operation due to a charge sharing between the circuit and the bypass capacitor; and compensates for the value of the bypass capacitor using an output of the circuit.

Another exemplary method of an embodiment of the invention provides an in put voltage droop compensation in video/graphics front-end systems. The method captures input voltage information to an ADC operatively coupled to a bypass capacitor in a video/graphics front-end system; calculates a droop in the input voltage in ADC due to a charge sharing between an input sampling capacitor of the ADC and the bypass capacitor; and compensates for the value of the bypass capacitor using an output of the ADC.

An exemplary system of an embodiment of the invention provides an input voltage droop compensation in video/graphics front-end systems. The system includes a means for capturing input voltage information to an ADC operatively coupled to a bypass capacitor in a video/graphics front-end system; a means for calculating a droop in the input voltage in the ADC due to a charge sharing between an input sampling capacitor of the ADC and the bypass capacitor; a digital logic operatively coupled to a stage of the ADC for processing a digital output of the stage; and a Digital-To-Analog converter (DAC) operatively coupled to the digital logic for converting the digital output to an analog output and for compensating for the value of the bypass capacitor by charging the bypass capacitor to the analog output.

Other aspects and example embodiments are provided in the Figures and the Detailed Description that follows.

BRIEF DESCRIPTION OF THE DRAWINGS

FIG. 1 illustrates a simplified block diagram of a video/graphics front-end system according to the prior art;

FIG. 2 schematically illustrates a typical signal sampling and charge transfer circuit used in a prior art video/graphics front-end system together with schematic depictions of corresponding sample and hold phase effective circuits thereof;

FIG. 3 is a flow diagram illustrating the steps in a method for input voltage droop compensation in video/graphics front-end system according to an embodiment of the invention;

FIG. 4 is a block diagram illustrating an exemplary implementation of a video/graphics front-end system having input voltage droop compensation according to an embodiment of the invention.

DETAILED DESCRIPTION OF THE EMBODIMENTS

Referring again to the Drawing, FIG. 3 illustrates the steps 300 in a method for input voltage droop compensation in a video/graphics front-end system according to an embodiment of the invention. In step 305, input voltage information supplied to a circuit operatively coupled to an off-chip DC bypass capacitor at the input of a video/graphics front-end system is captured by sampling the voltage stored on the capacitor. In one embodiment of the invention, the input voltage information is sampled and transferred to a first stage of the circuit where it is digitized. However, due to the charge sharing between the off-chip bypass capacitor and a set of capacitors in the circuit used to perform a sample and hold function, the charge held in the bypass capacitor gradually reduces, and in turn reduces the value of the input voltage applied to the circuit. This is referred to as an input voltage droop.

Step 310 calculates a droop in the input voltage in the circuit operation due to a charge sharing between the circuit and the bypass capacitor. Step 315 compensates for the value of the bypass capacitor using the output of the circuit. A coarse compensation for the bypass capacitance is performed at the first stage of the circuit operation and a fine compensation is performed using the output of the subsequent stages of the circuit operation. It will be appreciated that the circuit mentioned above includes any integrated circuit in the video/graphic front-end systems including an ADC and a front-end amplifier.

In a preferred embodiment of the invention, the input voltage droop compensation is performed using the output of an ADC operatively coupled to the sampling network coupled to the bypass capacitor. As stated above, the input voltage information supplied to an ADC operatively coupled to the bypass capacitor of the video/graphics front-end system is captured. A droop in the input voltage in the ADC due to a charge sharing between an input sampling capacitor of the ADC and the bypass capacitor is then detected. The voltage droop is compensated using an output of the ADC. According to the invention, common mode input voltage droop as well as the differential mode input voltage droop is compensated. It will be appreciated that the video/graphics front-end systems of the embodiments of the invention is provided by way of illustration, and not limitation. Those knowledgeable in the art will recognize that the embodiments of the invention can also be used in other multimedia processing systems.

As known in the prior art, the error caused due to the input voltage droop depends on two factors namely, ratio of the two capacitances (capacitances of bypass capacitor and sampling capacitor) and the total time taken for the clock cycles of the ADC. If either of these two factors is small, the ADC can tolerate a considerable amount of error due to input voltage droop. Hence, for a high resolution ADC, a high capacitance bypass capacitor is required. According to the embodiments of the invention, the value of the bypass capacitor can be considerably reduced when used with a high resolution ADC. This offers an increased freedom in the choice of off-chip DC-bypass capacitance used in video/graphics front-end systems.

FIG. 4 is a block diagram 400 illustrating an exemplary implementation of the input voltage droop compensation method of FIG. 3 according to an embodiment of the invention. The block diagram 400 includes a bypass capacitor 405 coupled to an ADC core. The ADC is preceded by a sampling network and a Programmable Gain Amplifier (PGA) 410. The ADC core includes a plurality of stages. The block labeled as 'stage 1', 415 represents one stage of the ADC operation. The ADC includes several such stages labeled as 'Stage 2-N', 445. A typical stage of the ADC includes a sub ADC 420, a DAC 425 and a residue amplifier 430. The sampling network 410 samples the input analog value onto the sampling capacitor of a stage in the ADC. The gain of the programmable gain amplifier 410 is adjusted in such a way that the dynamic range of the ensuing ADC is completely used.

The droop compensation mechanism of the embodiment of the invention compensates the voltage droop by operating on the various stage outputs of the ADC. As discussed earlier, the input voltage droop on the external bypass capacitor 405 is caused due to charge sharing between the external bypass capacitor 405 and the sampling capacitor of the ADC. The input voltage droop depends on the input voltage value, and hence, the input voltage value is a good representation of the extent of droop expected at the input. The input value is available in digitized form at the output of the ADC, and hence, the ADC output can be used to perform the compensation. The digital output from each of the ADC stages is post-processed by a digital logic 435 and converted to an analog signal using a DAC 440. This analog signal is used for charging the bypass capacitor 405 thereby compensating the voltage droop.

To minimize latency, the droop compensation mechanism operates on the digital output obtained from the sub-ADC 420 of the various stages of the pipeline ADC. A low-latency coarse compensation is provided by using the digital output of the first stage 415 of the ADC while a fine compensation is provided by using the complete ADC output. The outputs of the subsequent stages (Stages 2-N, 445) are passed through pipeline logic 450 and post-processed by a digital logic 435 and converted to an analog signal using the DAC 440. This analog signal is then used to charge the bypass capacitor 405. The digital bits are input to the DAC 440, and the output of the DAC 440 (which depends on the input code) is used to charge the external bypass capacitor 405. Since, the digital input to the DAC 440 is dependent on the droop, the compensation (dependent on the DAC 440 output) will also depend on the droop.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method comprising:
    capturing input voltage information to a circuit operatively coupled to a bypass capacitor in a video/graphics front-end system;
    calculating a droop in said input voltage in said circuit operation due to a charge sharing between the circuit and said bypass capacitor; and
    compensating for the value of the droop in the bypass capacitor using an output of the circuit.

2. The method of claim 1, wherein said capturing comprises:
    capturing said input voltage information to a first stage operation of the circuit.

3. The method of claim 1, wherein said compensating comprises compensating a common mode voltage droop.

4. The method of claim 1, wherein said compensating comprises compensating a differential mode voltage droop.

5. The method of claim 1, wherein said compensating comprises:
    performing a coarse compensation at the first stage of the circuit operation; and
    performing a fine compensation using the output of the subsequent stages of the circuit operation.

6. The method of claim 1, wherein said circuit comprises a pipelined analog-to-digital converter.

7. The method of claim 1, wherein said circuit comprises a front-end amplifier.

8. A method comprising:
    capturing input voltage information to an analog-to-digital converter operatively coupled to a bypass capacitor in a video/graphics front-end system;
    calculating a droop in said input voltage in said analog-to-digital converter due to a charge sharing between an input sampling capacitor of the analog-to-digital converter and said bypass capacitor; and
    compensating for the value of the droop in the bypass capacitor using an output of the analog-to-digital converter.

9. The method of claim 8, wherein said capturing comprises:
    capturing said input voltage information to a first stage of a plurality of stages in the analog-to-digital converter.

10. The method of claim 8, wherein said compensating comprises compensating a common mode voltage droop.

11. The method of claim 8, wherein said compensating comprises compensating a differential mode voltage droop.

12. The method of claim 8, wherein said compensating comprises
    performing a coarse compensation using the output of the first stage of the analog-to-digital converter; and
    performing a fine compensation using the output of the subsequent stages of the analog-to-digital converter.

13. The method of claim 8, wherein the analog-to-digital converter comprises a pipelined analog-to-digital converter.

14. The method of claim 8, whereby an increased input voltage swing at the input of the video/graphics front-end system can be supported.

15. The method of claim 8, whereby the capacitance value of the bypass capacitor is reduced.

16. A system comprising:
    a means for capturing input voltage information to an analog-to-digital converter operatively coupled to a bypass capacitor in a video/graphics front-end system;
    a programmable gain amplifier for optimizing dynamic range of said analog-to-digital converter, wherein said programmable gain amplifier and a sampling network couples said analog-to-digital converter with said bypass capacitor;
    a means for calculating a droop in said input voltage in said analog-to-digital converter due to a charge sharing between an input sampling capacitor of the analog-to-digital converter and said bypass capacitor;
    a digital logic operatively coupled to a stage of the analog-to-digital converter for processing a digital output of said stage; and
    a digital-to-analog converter operatively coupled to said digital logic for convening said digital output to an analog output and for compensating for the value of the droop in the bypass capacitor by charging the bypass capacitor to said analog output.

17. The system of claim 16, wherein said means for capturing input voltage information captures the input voltage information to a first stage of a plurality of stages in the analog-to-digital converter.

18. The system of claim 16 compensates a common mode voltage

19. The system of claim 16 compensates a differential mode voltage droop.

20. The system of claim 16, wherein the analog-to-digital converter comprises a pipelined analog-to-digital converter.

* * * * *